United States Patent

Jeon et al.

(10) Patent No.: US 6,569,782 B2
(45) Date of Patent: May 27, 2003

(54) INSULATING LAYER, SEMICONDUCTOR DEVICE AND METHODS FOR FABRICATING THE SAME

(75) Inventors: Jin-Ho Jeon, Seoul (KR); Byoung-Deog Choi, Gyeonggi-do (KR); Jong-Seung Yi, Gyeonggi-do (KR); Tae-Wook Seo, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 20 days.

(21) Appl. No.: 09/800,892

(22) Filed: Mar. 8, 2001

(65) Prior Publication Data

US 2002/0000644 A1 Jan. 3, 2002

(30) Foreign Application Priority Data

Jun. 15, 2000 (KR) ........................................ 2000-32893

(51) Int. Cl.[7] .............................................. H01L 21/31
(52) U.S. Cl. ........................ 438/783; 438/784; 438/787; 438/760; 438/763
(58) Field of Search ................................ 438/783, 784, 438/787, 760, 763, 789, 790; 257/600, 633

(56) References Cited

U.S. PATENT DOCUMENTS

| 4,668,973 A | | 5/1987 | Dawson et al. ............. 257/637 |
|---|---|---|---|
| 5,646,075 A | * | 7/1997 | Thakur et al. ...... 148/DIG. 133 |
| 5,862,057 A | * | 1/1999 | Xia et al. .................... 438/646 |
| 5,888,910 A | * | 3/1999 | Park ............................ 438/760 |
| 6,090,725 A | * | 7/2000 | Yang et al. .................. 438/624 |
| 6,114,216 A | * | 9/2000 | Yieh et al. ................... 438/424 |
| 6,159,870 A | * | 12/2000 | Chakravarti et al. ........ 438/763 |
| 6,248,667 B1 | * | 6/2001 | Kim et al. .................. 438/424 |
| 6,261,975 B1 | * | 7/2001 | Xia et al. .................... 438/763 |
| 2002/0130385 A1 | * | 9/2002 | Jung et al. ................... 257/524 |

FOREIGN PATENT DOCUMENTS

| EP | 0 497 541 A1 | | 8/1992 | |
|---|---|---|---|---|
| EP | 080 869 A2 | | 8/1998 | |
| JP | 62-1232 | * | 1/1978 | ......... H01L/21/302 |
| JP | 59-222945 | | 12/1984 | |
| JP | 1-122139 | | 5/1989 | |
| JP | 2-1922 | * | 1/1990 | ....... H01L/21/3205 |
| JP | 4-164330 A | * | 6/1992 | ....... H01L/21/3205 |
| JP | 8-17926 | | 1/1996 | |
| TW | 275699 A | * | 5/1996 | ......... H01L/21/205 |

* cited by examiner

Primary Examiner—Eddie Lee
Assistant Examiner—José R. Díaz
(74) Attorney, Agent, or Firm—Volentine Francos, PLLC

(57) ABSTRACT

An insulating layer having a BPSG layer, a semiconductor device and methods for fabricating them. After preparing an oxidizing atmosphere using an oxygen gas, a first seed layer is formed with a tetraethylorthosilicate (TEOS) and the oxygen gas. Thereafter, a second seed layer, used to form an insulating layer capable of controlling an amount of a boron, is formed by means of using a triethylborate (TEB), the TEOS and the oxygen gas. Then, the insulating layer having a BPSG layer is formed using the TEB, a triethylphosphate, the TEOS and an ozone gas. About 5.25 to 5.75% by weight of the boron and about 2.75 to 4.25% by weight of the phosphorous are added to the insulating layer.

13 Claims, 10 Drawing Sheets

INSULATING LAYER, SEMICONDUCTOR DEVICE AND METHODS FOR FABRICATING THE SAME

BACKGROUND OF THE INVENTION

1. Field of the Invention

The present invention relates to an insulating layer, a semiconductor device and methods for fabricating the same, and more particularly, to an insulating layer, a semiconductor device and methods for fabricating the same that includes a borophosphosilicateglass (BPSG) layer to control the additive amounts of boron (B) and phosphorous (P) most efficiently.

2. Description of the Related Art

Semiconductor devices require high capacity and fast operating speeds to power today's electronic devices. Accordingly, semiconductor device manufacturing methods continually strive to improve the integration density, reliability, and response times of the devices. As one example, consider the DRAM memory class, where 16M and 64M devices are being mass produced, 256M devices are starting to be mass produced, and plans for mass production of 1G devices are being explored.

Critical techniques to improve the integration density of semiconductor devices include layer fabricating techniques for insulating and conductive layers. The layer fabricating techniques can largely be classified into physical vapor deposition and chemical vapor deposition. The chemical vapor deposition technique provides a gas source, which includes supplying an element of an object material to be formed, and a reaction gas onto a substrate, and then forms a layer on the substrate by heating the substrate to initiate a chemical reaction.

As the semiconductor devices become more advanced, the parameters and requirements for the processing techniques to form a layer used for fabricating a semiconductor device are becoming more rigorous. This is because the insulating layers and conducting layers are formed in a multi-layer structure, and those layers have to be formed in a fine pattern with a design rule of 0.15 $\mu$m or less.

When those layers are formed to have the fine patterns, the process characteristics for making the fine pattern affect not only the layer on which the fine pattern is formed, but also the underlying and upper layers. Therefore, when the layers are formed, the chemical and physical characteristics of the other layers must be considered when deciding on the process characteristics of the layer to be formed.

A phosphosilicateglass (PSG) layer, which dopes phosphorus into an oxidized material, or a BPSG layer, which dopes boron and phosphorus into an oxidized material, are the primary layer types used for an insulating layer to protect a surface or to electrically isolate a metal wire. This is mainly due to the excellent step coverage of the PSG layer or the BPSG layer. Also, the PSG or BPSG layers getter alkali ion while reacting as a diffusion wall against humidity, and the processes for forming the layers can easily be performed in a low temperature regime.

However, there is a disadvantage to using PSG or BPSG layers. Since these layers have enough fluidity and create a diffusion wall during a reflow process, the layers also operate as an intermediary to pass on the humidity to the underlying layers. Accordingly, in a case where a layer is composed of a material that can be damaged by humidity, or an underlying substrate is made of silicon, it may cause a serious problem. Therefore, a method to minimize the influence of the humidity has to be fully considered when the PSG and BPSG layers are being formed.

Examples for forming PSG and BPSG insulating layers are disclosed in U.S. Pat. No. 4,668,973 (issued to Dawson et al.), Japanese Patent Laid-Open No. Sho 59-22945, Japanese Patent Laid-Open No. Hei 1-122139, and Japanese patent Laid-Open No. Hei 8-17926.

In U.S. Pat. No. 4,668,973, the PSG layer is formed by adding 7% or less of phosphorus into a nitride silicon layer after forming the nitride silicon layer on the substrate. Accordingly, the nitride silicon layer prevents the humidity from penetrating into the substrate even though the PSG layer has been reflowed. Furthermore, even if a window is formed at the PSG layer, since the substrate is not directly exposed by means of the nitride silicon layer, the substrate may be prevented from being oxidized.

In Japanese Patent Laid-Open No. Sho 59-222945, a nitride silicon layer is formed on a substrate and then a BPSG layer is formed on the nitride silicon layer. The nitride silicon layer prevents the humidity from penetrating into the substrate even though the BPSG layer has been reflowed. Therefore, it is able to prevent the substrate from being oxidizing by direct exposure.

In Japanese Patent Laid-Open No. Hei 1-122139, a nitride silicon layer is successively formed on the substrate and a gate electrode and thereafter a BPSG layer containing boron is formed. Therefore, the nitride silicon layer prevents the humidity from penetrating into the substrate or the gate electrode even though the BPSG layer has been reflowed.

In Japanese Patent Laid-Open No. Hei 8-17926, an oxide silicon layer is formed onto a polysilicon layer and then the BPSG layer is formed onto the oxide silicon layer. Therefore, the oxide silicon layer prevents the humidity from penetrating into the polysilicon layer or the substrate even if the BPSG layer has been reflowed.

In this way, when forming the insulating layer including the PSG layer or BPSG layer, the effect of the humidity can be minimized by means of forming the PSG layer or BPSG layer on the underlying nitride silicon layer. Also, the nitride silicon layer prevents the underlying layer or the substrate from being damaged by means of etching, for example, when a portion of the insulating layer is patterned and etched to form a window.

In the present fabricating method for a semiconductor device having elevated regions and recessed regions composed of minute windows or gate electrodes, one must consider the need to sufficiently force or charge the BPSG insulating layer into the recessed regions of the windows or the gate electrodes. Therefore, a chemical vapor deposition using a tetraethylorthosilicate (TEOS), a triethylborate (TEB), a triethylphosphate (TEPO), an oxygen gas and an ozone gas is employed to form the BPSG layer.

The BPSG layer is formed as follows. First, an oxidizing atmosphere for easily forming the BPSG layer is prepared using oxygen gas. After forming a first seed layer onto an etch stop layer comprising the nitride silicon layer using the TEOS and the oxygen gas, a second seed layer is formed onto the first seed layer using the triethylborate (TEB), the triethylphosphate (TEPO), the tetraethylorthosilicate (TEOS) and the oxygen gas. The constituents of the first and second seed layers determine the amount of boron and phosphorous added into the BPSG layer. Subsequently, the BPSG layer is formed onto the etch stop layer including the first and the second seed layers by using the triethylborate, the triethylphosphate, the tetraethylorthosilicate and the ozone gas. With this method, the BPSG layer is formed with a relatively large amount of phosphorous because the triethylphosphate is used to form the second seed layer.

While the BPSG layer has sufficient fluidity for normal circumstances, in a subsequent reflow process with nitrogen gas, the BPSG layer is not fully charged or filled into the recessed regions voids are frequently generated.

Therefore, oxygen gas and hydrogen gas are sometimes used instead of nitrogen gas to reflow the BPSG layer to minimize the generation of voids. However, when the BPSG layer has been reflowed with the oxygen gas and the hydrogen gas, the thickness of the etch stop layer under the BPSG layer is decreased. This is because phosphoric acid $H_3PO_4$ is generated by a chemical reaction between the triethylphosphate, which determines the amount of phosphorus, and the oxygen gas and the hydrogen gas, which acid etches the etch stop layer while reflowing progresses.

Indeed, the thickness of the etch stop layer decreased by about 30% after reflowing with oxygen/hydrogen according to an analyzed result of the etch stop layer before and after the reflow with a transmission electron microscope (TEM). Also, using auger electron spectroscopy (AES), it was seen that the oxidized materials composing the etch stop layer after reflowing have been increased about 0.2 times more than before reflowing. This confirms that the thickness of the etch stop layer is decreased by the reflowing process and the oxidization is progressing thereby.

Given the above, the etch stop layer is unable to appropriately control the etching process when the BPSG layer is etched to form a BPSG layer pattern having a window after the reflowing. Consequently, the substrate under the etch stop layer is exposed, or even the substrate itself is etched. In a semiconductor device fabricating process which requires a fine pattern such as a self-aligned contact, the decrease in thickness of the etch stop layer precludes attaining a sufficient shoulder margin between the gate electrodes.

Even when using a BPSG layer containing a relatively large amount of the boron, rather than the PSG layer containing a relatively large amount of the phosphorous, the BPSG layer is not charged into the recessed region and voids are created because the BPSG layer does not have sufficient fluidity. Also, since the BPSG layer has an isotropic etch characteristic, the etched window that is formed is larger than a predetermined critical dimension CD. Therefore, in the subsequent process for charging the window, the inside portion of the window is not sufficiently charged and a void is generated. Accordingly, when the layer for charging the window is made of a metal, the void may cause a bridge.

As described above, since the amount of the phosphorous and the boron added to the BPSG layer is not controlled, the thickness of the underlying etch stop layer decreases or the etch stop layer has the isotropic etch characteristic, whereby the reliability of the semiconductor device fabricating method is reduced.

SUMMARY OF THE INVENTION

Therefore, it is an object of the present invention to provide an insulating layer including a BPSG layer capable of optimizing the amount of boron and phosphorous without a changing the characteristics of the layer.

It is another object of the present invention to provide a method for forming an insulating layer including a BPSG layer capable of optimizing the amount of the boron and phosphorous without changing the characteristics of the layer.

It is still another object of the present invention to provide a semiconductor device including an insulating layer constituted of a BPSG layer capable of optimizing the amount of boron and phosphorous without changing the characteristics of the layer.

To achieve the aforementioned object, the present invention includes an insulating layer of a semiconductor device comprising a BPSG layer, in which about 5.25–5.75% by weight of boron and about 2.75–4.25% by weight of phosphorus are added to a tetraethylorthosilicate.

To achieve another object of the present invention, there is provided a method for forming an insulating layer including steps of preparing an oxidizing atmosphere to form the insulating layer on a substrate by using an oxygen gas, forming a first seed layer of the insulating layer on the substrate by using a tetraethylorthosilicate and an oxygen gas, forming a second seed layer of the insulating layer capable of controlling an amount of a boron added to the first seed layer by using a triethylborate, the tetraethylorthosilicate and the oxygen gas, and forming a BPSG layer capable of controlling the amount of the boron and a phosphorus added to the insulating layer having the first seed layer and second seed layer by using the triethylborate, triethylphosphate, the tetraethylorthosilicate and an ozone gas.

The insulating layer can be formed as follows. After preparing the oxidizing atmosphere, the first seed layer is formed by providing the tetraethylorthosilicate and the oxygen gas with a mixed ratio of 1:5.4 to 5.8, and the second seed layer is formed by providing the tetraethylorthosilicate, the triethylborate and the oxygen gas with a mixed ratio of 1:0.2 to 0.3:5.4 to 5.8. Next, the BPSG layer is formed onto the first seed layer and the second seed layer by providing the tetraethylorthosilicate, the triethylborate, the triethylphosphate and the ozone gas with a mixed ratio of 1:0.2 to 0.3:0.09 to 0.12:5.4 to 5.8. The insulating layer is formed under a reduced pressure (which is close to a vacuum environment) in an atmosphere of helium gas and a nitrogen gas with a mixed ratio of 1:1.8 to 2.2.

The etch stop layer on the substrate consists of a nitride silicon layer to prevent the substrate from being damaged by etching when the insulating layer is etched. The insulating layer is reflowed with hydrogen and oxygen gas to evenly form the upper surface of the insulating layer and simultaneously charge the recessed regions among the elevated regions and the recessed regions at the surface of the substrate.

Even though the insulating layer has been reflowed by the oxygen gas and the hydrogen gas, the etch stop layer prevents the substrate from being damaged, so that an isotropic etch characteristic can be reduced. As a result, the recessed regions can be fully charged and simultaneously the insulating layer can be etched in an anisotropic etch. Accordingly, the inventive insulating layer having the BPSG layer can be appropriately adopted to form a self-aligned contact and a fine pattern.

To achieve still another object of the present invention, there is provided a semiconductor device including a substrate having a gate electrode formed at an upper portion of the substrate, a source and a drain formed at a lower portion of both sides of the gate electrode, and an insulating layer to which about 5.25–5.75% by weight of boron and about 2.75–4.25% by weight of phosphorus is added, where the insulating layer is continuously formed on the substrate and the gate electrode.

To achieve yet another object of the present invention, there is provided a method for fabricating a semiconductor device including the steps of forming an etch stop layer on a substrate for preventing the substrate from being damaged by etching, forming an insulating layer, to which about 5.25–5.75% by weight of boron and about 2.75–4.25% by weight of phosphorus is added, on the etch stop layer, reflowing the insulating layer to evenly form an upper surface of the insulating layer and simultaneously charge recessed regions with the insulating layer among elevated regions and recessed regions of the substrate, and etching a predetermined portion of the insulating layer to form an insulating layer pattern having a window which exposes the surface of the underlying etch stop layer.

The substrate has elevated regions and recessed regions and the elevated regions and the recessed regions are formed by the gate electrodes and the patterns having the window.

The etch stop layer is formed to have a thickness of about 60 to 140 Å by using a nitride silicon gas and the insulating layer is formed to have a thickness of about 9,000 to 10,000 Å. The etch stop layer and the insulating layer are formed by means of a chemical vapor deposition.

Accordingly, the recessed regions can be sufficiently charged and simultaneously the insulating layer can be etched by an anisotropic etch. By controlling the amount of added phosphorus and boron most efficiently, the etch stop layer prevents the substrate from being etched even though the insulating layer having the BPSG layer has been reflowed and the isotropic etch characteristic is reduced. Therefore, the insulating layer having the BPSG layer can be appropriately adopted for the self-aligned contact which requires the design rule of 0.15 um or less or for forming fine patterns.

BRIEF DESCRIPTION OF THE DRAWINGS

The above objects and other advantages of the present invention will become more apparent by describing in detail with reference to the attached drawings, in which.

DESCRIPTION OF THE PREFERRED EMBODIMENT

Hereinafter, the present invention will now be described more fully with reference to the accompanying drawings, in which preferred embodiments of the present invention are shown.

Figure 1A:
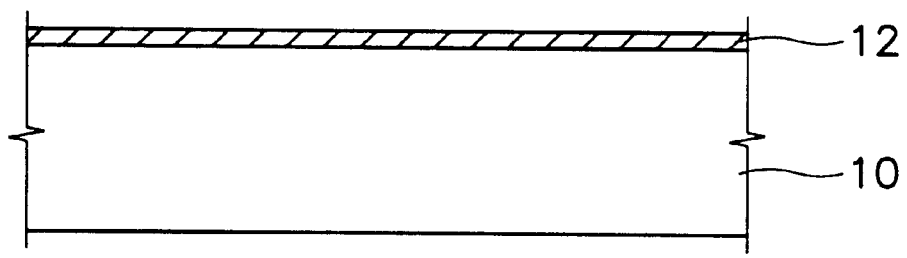
FIG. 1A to FIG. 1F are sectional views illustrating a method for fabricating an insulating layer according to a preferred embodiment of the present invention.

FIG. 1A to FIG. 1F are sectional views illustrating a method for forming an insulating layer according to a preferred embodiment of the present invention. Referring to FIG. 1A, an etch stop layer 12 is formed on a substrate 10.

The etch stop layer 12 is formed by chemical vapor deposition using a nitride silicon. Therefore, when an insulating layer formed on the substrate 10 is etched, the etch stop layer 12 prevents the substrate 10 from being damaged by the etching and simultaneously prevents the substrate 10 from being oxidized by exposure to an oxygen containing environment. Also, the etch stop layer 12 prevents any humidity generated while the insulating layer is reflowed from penetrating into the substrate 10, since the insulating layer can operate as an intermediary in delivering the humidity to adjacent layers.

As described later, an insulating layer including a BPSG layer, to which boron and phosphorous are added, is formed on the etch stop layer 12. The insulating layer is formed by chemical vapor deposition.

Figure 2:
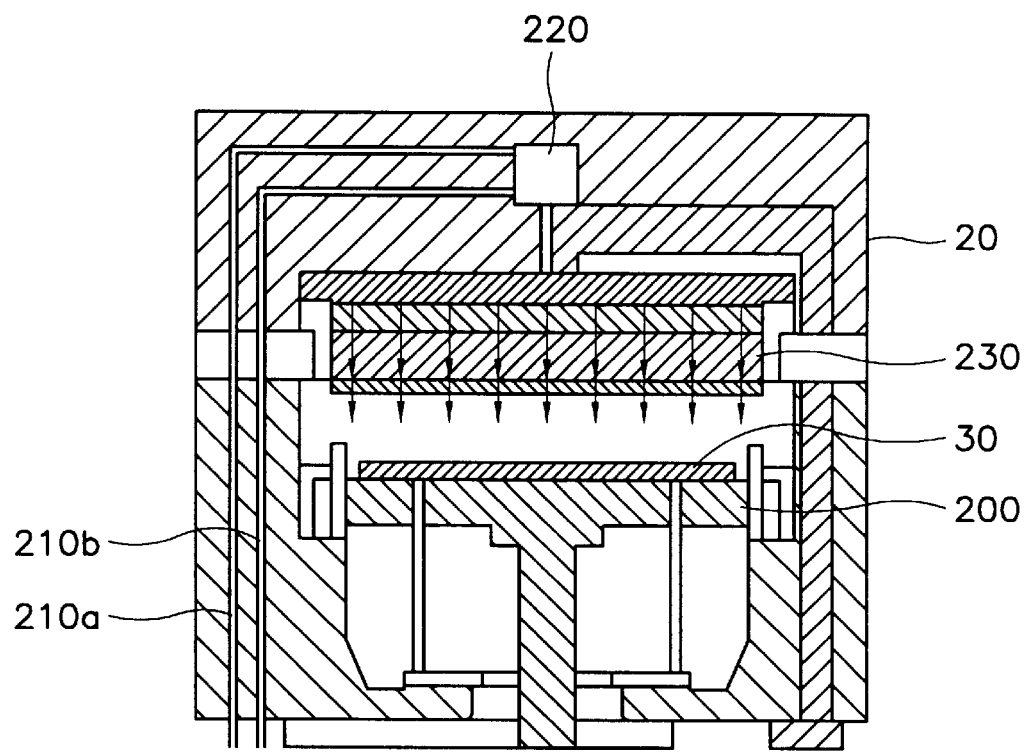
FIG. 2 is a cross-sectional view showing an apparatus for forming an insulating layer according to a preferred embodiment of the present invention.

Jumping to FIG. 2, there is shown a cross-sectional view of an apparatus for forming an insulating layer according to a preferred embodiment of the present invention. In FIG. 2, a stage 200 is equipped to accommodate a exemplary substrate 30 thereon. In the stage 200, heating elements for heating the substrate 30 are installed when the insulating layer is formed. Also, elevating elements for lifting the substrate 30 up and down are arranged in the stage 200, and the substrate 30 is lifted up and down by the elevating elements when the insulating layer is formed. Since the lifting operation of the substrate 30 affects the uniformity of the insulating layer, the lifting operation intervals have to be controlled at respective steps. Gas supplying lines 210a and 210b for supplying reaction gases at each step, and a gas mixing box 220 for mixing the reaction gases supplied through the gas supplying lines 210a and 210b, are equipped in a chamber 20 having the stage 200.

A plate 230 in the upper part of the chamber 20 uniformly provides the reaction gases supplied through the gas mixing box 220 onto the substrate 30 in the chamber 20. Along the surface of the plate, holes for supplying gases are formed and the gases are uniformly supplied to the substrate 30 through the holes.

Figure 3:
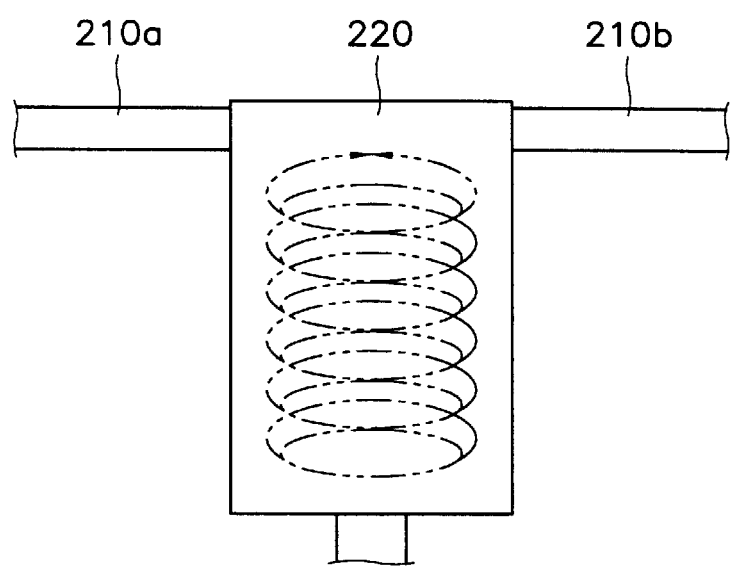
FIG. 3 is a schematic diagram describing a mixing process of the reaction gases shown in FIG. 2.

FIG. 3 is a schematic diagram describing a mixing process of the reaction gases shown in FIG. 2. In FIG. 3, the gas mixing box 220 is connected to the gas supplying lines 210a and 210b. The reaction gases are supplied into the gas mixing box 220 and mixed in the gas mixing box 220, and then supplied into the chamber 20.

Now, referring back to FIG. 1B, the insulating layer using the just described apparatus including the chamber is formed as follows.

Figure 1B:
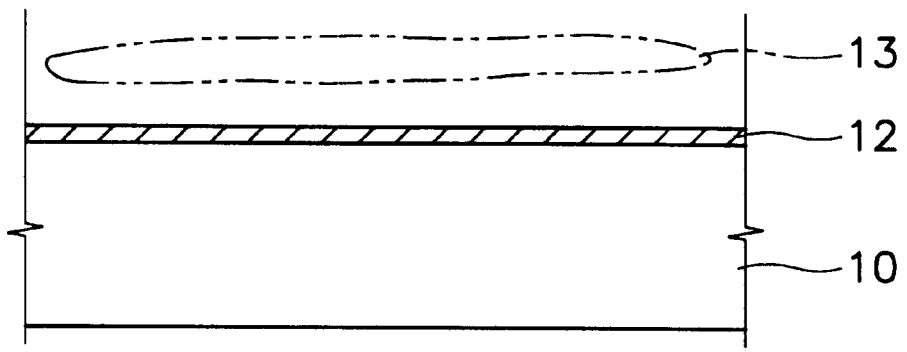

In FIG. 1B, when the substrate 10 having the etch stop layer 12 formed thereon is moved into the chamber 20, an oxygen gas is supplied into the chamber 20 at about 4,500 sccm to surround the substrate 10 in an oxidizing atmosphere 13 to maintain the uniformity of the insulating layer and this process continues for about 2 seconds. The pressure inside chamber 20 is reduced to be close to a vacuum condition, and is hereafter referred to generally as a vacuum environment, by utilizing pumping members connected to the chamber 20. The atmosphere is prepared with a helium gas of about 2,000 sccm and a nitrogen gas of about 4,000 sccm. Also, the stage 200 maintains the temperature at about 480° C. while heating the substrate, and the interval between the stage 200 and plate 230 is maintained at about 600 mils (note that 1 mil=25 μm).

Figure 1C:
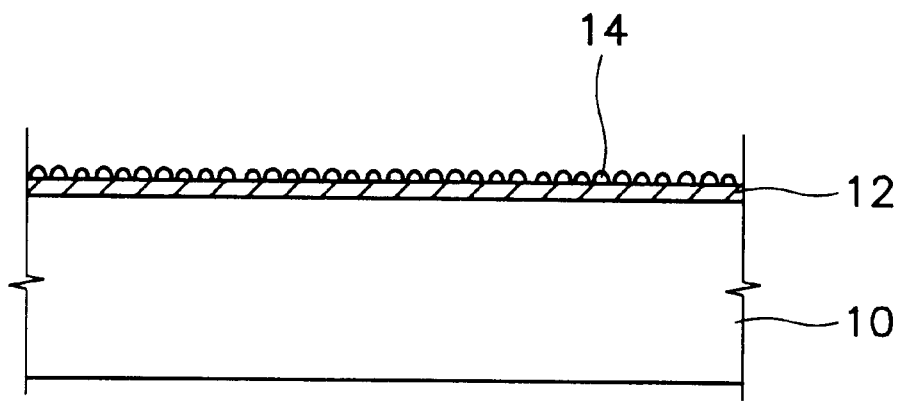

In FIG. 1C, after preparing the oxidizing atmosphere 13, a first seed layer 14 is formed on the etch stop layer 12 by using a tetraethylorthosilicate (TEOS) and an oxygen gas. The TEOS and the oxygen gas are supplied at about 800 sccm and about 4,500 sccm, respectively. The oxygen gas, which was used previously to prepare the oxidizing atmosphere 13, is continuously supplied, and the TEOS is supplied thereafter. Then they are mixed in the gas mixing box 220 and uniformly supplied onto the substrate 10 through the plate 230 to form the first seed layer 14. After preparing the oxidizing atmosphere, the first seed layer is formed by providing the tetraethylorthosilicate and the oxygen gas with a mixed ratio of 1:5.4 to 5.8. Also, the chamber 20 continuously maintains the vacuum environment. The stage 200 heats the substrate 10 while uniformly keeping the temperature at about 480° C. and the interval between the stage 200 and the plate 230 is kept at about 400 mils. The formation process for the first seed layer 14 continues for about 60 seconds.

Figure 1D:
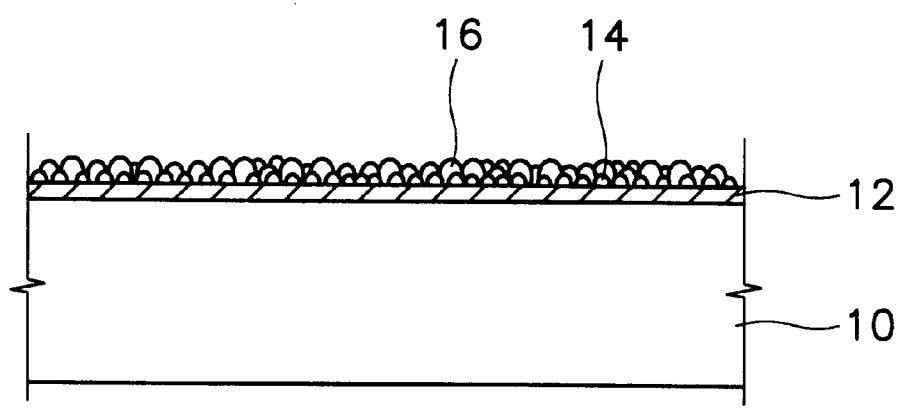

In FIG. 1D, after forming the first seed layer 14, a second seed layer 16 is formed on the first seed layer 14 by using a triethylborate (TEB), the TEOS and the oxygen gas. About 200 sccm of TEB, about 800 sccm of TEOS, and about 4,500 sccm of the oxygen gas are supplied. The TEOS and the oxygen gas for the previously formed first seed layer 14 are continuously supplied, and the TEB is supplied thereafter. They are mixed in the gas mixing box 220 and uniformly supplied onto the substrate 10 through the plate 230 to form the second seed layer 16. The second seed layer is formed by providing the TEOS, the TEB and the oxygen gas with a mixed ratio of 1:0.2 to 0.3:5.4 to 5.8. The chamber 20 continuously maintains a vacuum environment, the stage 200 heats the substrate 10 while uniformly keeping the temperature at about 480° C., and the interval between the stage 200 and the plate 230 is kept at about 310 mils. The process to form the second seed layer 16 is continuously executed for about 23 seconds.

The TEB is used as a source of a boron added to an insulating layer when the insulating layer having a BPSG layer is formed. The TEB is able to be mixed with the TEOS without generating a residuum and is stable with respect to heat.

Figure 1E:
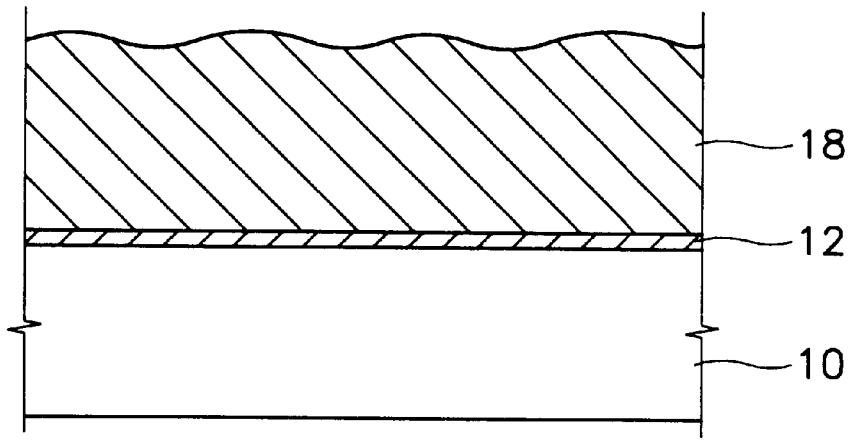

In FIG. 1E, after forming the second seed layer 16, an insulating layer 18 having the BPSG layer is formed on the etch stop layer 12 which includes the first seed layer 14 and the second seed layer 16 by using the TEB, the triethylphosphate (TEPO), the TEOS and ozone gas. About 200 sccm of the TEB, about 85 sccm of the TEPO, about 800 sccm of the TEOS, and about 4,500 sccm of the ozone gas are supplied, respectively. The TEOS and the TEB for the previously formed second seed layer 16 are continuously supplied, and the TEPO and the ozone gas are supplied thereafter, with the oxygen gas being cut off. They are mixed in the gas mixing box 220 and uniformly supplied onto the substrate 10 through the plate 230 to form the insulating layer 18. The BPSG layer is formed onto the first seed layer and the second seed layer by providing the TEOS, the TEB, the TEPO and the ozone gas with a mixed ratio of 1:0.2 to 0.3:0.09 to 0.12:5.4 to 5.8. The chamber 20 is continuously maintained in a vacuum environment, the stage 200 heats the substrate 10 while uniformly keeping the temperature at about 480° C., and the interval between the stage 200 and the plate 230 is kept at about 310 mils. The process to form the insulating layer 18 is continuously executed for about 160 seconds.

The TEPO is used as source of phosphorous added to the insulating layer 18 when the insulating layer 18 having a BPSG layer is formed, and the TEPO is now more widely used rather than phosphine ($PH_3$).

Figure 4:
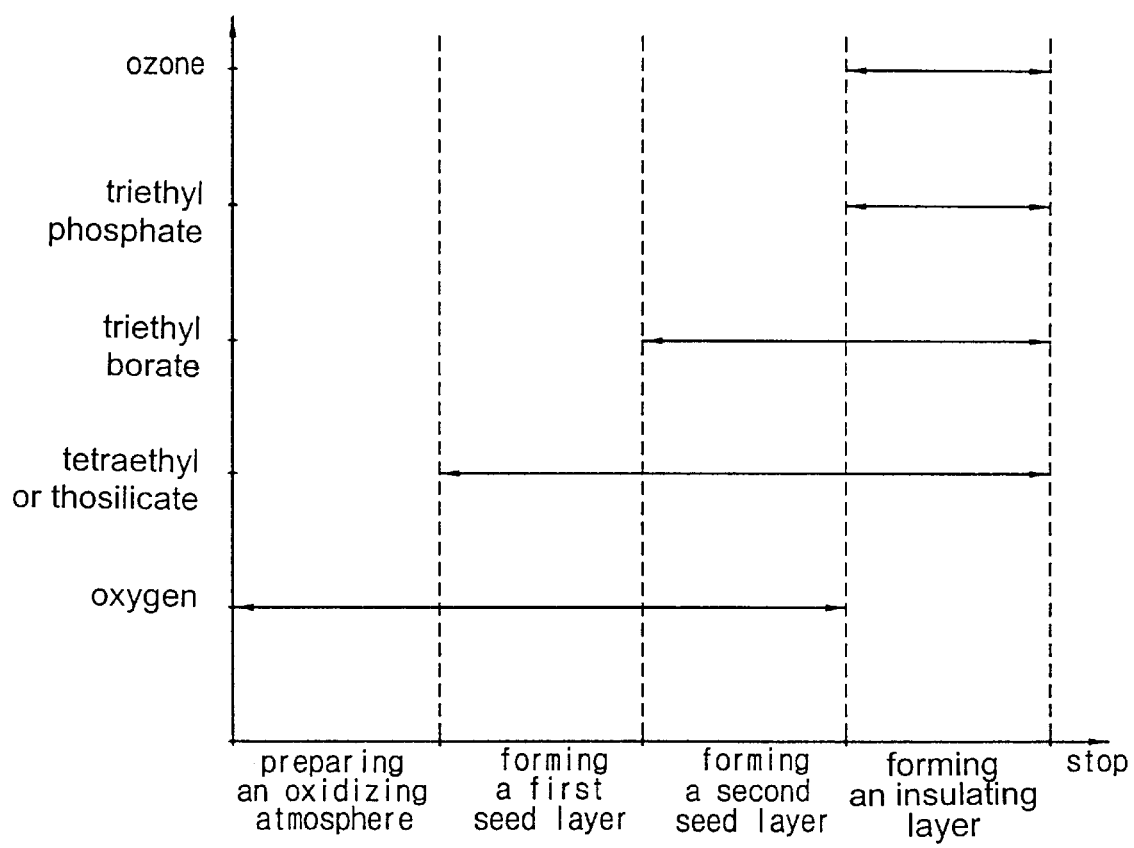
FIG. 4 is a graph classifying the materials used in a process to form an insulating layer of the present invention in respective steps.

FIG. 4 is a graph classifying and summarizing the materials used in the process to form an insulating layer of the present invention in respective steps. In FIG. 4, the oxygen gas is supplied to prepare the oxidizing atmosphere and to form the first and the second seed layers; the TEOS is supplied to form the first seed layer, the second seed layer and the insulating layer; the TEB is supplied to form the second seed layer and the insulating layer; and the TEPO and the ozone gas are supplied to form the insulating layer.

As such, an insulating layer having a BPSG layer with about 5.5% by weight of the boron and about 3.0% by weight of the phosphorous is formed by controlling the triethylborate (TEB) provided as a source material of the boron and the triethylphosphate (TEPO) provided as a source material of the phosphorous. Accordingly, an insulating layer which has enough fluidity and simultaneously secures uniformity of surface can be formed.

Figure 1F:
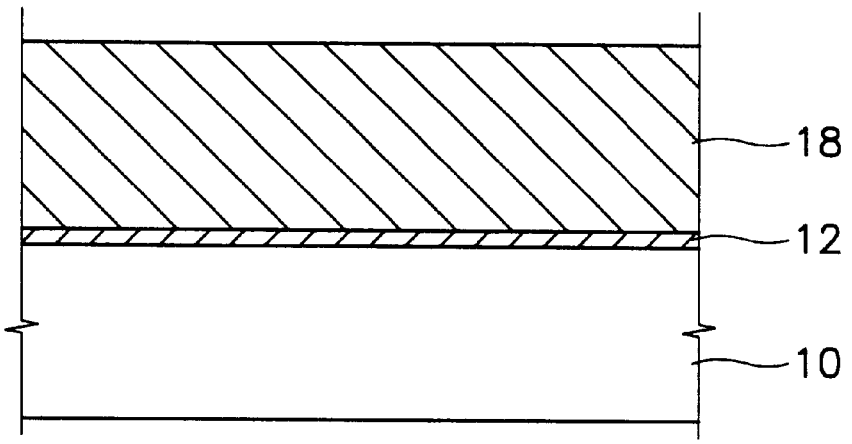

Referring to FIG. 1F, the insulating layer 18 is reflowed at a temperature of about 850° C. utilizing oxygen gas and hydrogen gas. Consequently, the surface of the insulating layer 18 is evenly formed and simultaneously the recessed regions are charged with the insulating layer 18 among the elevated regions and the recessed regions of the substrate 10. Humidity is generated during the reflowing process, and the insulating layer 18 acts as a diffusion wall against the humidity and getters alkali ion. However, the humidity does not penetrate into the substrate 10 due to the etch stop layer 12.

Furthermore, the thickness of the etch stop layer 12 is not decreased by more than 10 Å even if the insulating layer 18 is reflowed. This is because that the humidity reacts with the triethylphosphate (TEPO) added as the source material of the phosphorous and minimizes the generation of the phosphoric acid.

An anisotropic etch characteristic can be sufficiently secured when etching the insulating layer 18 to form an insulating layer pattern having a window, while preventing the thickness of the etch stop layer 12 from being decreased and at the same time, thoroughly charging the recessed regions. Accordingly, since the amount of the boron and the phosphorous added to the insulating layer 18 having the BPSG layer is appropriately controlled, the critical diameter of the window can be formed with a predetermined size.

By forming the insulating layer 18 having a BPSG layer with about 5.5% by weight of the boron and about 3.0% by weight of the phosphorous, the decrease in thickness of the etch stop layer 12 by reflowing the insulating layer 18 can be minimized, and the charging effect and the anisotropic etch characteristic can also be sufficiently secured.

The present inventors continued experimenting to determine the most advantageous amounts of boron and phosphorous that could be added without changing the characteristics of the insulating layer having the BPSG layer.

Figure 5:
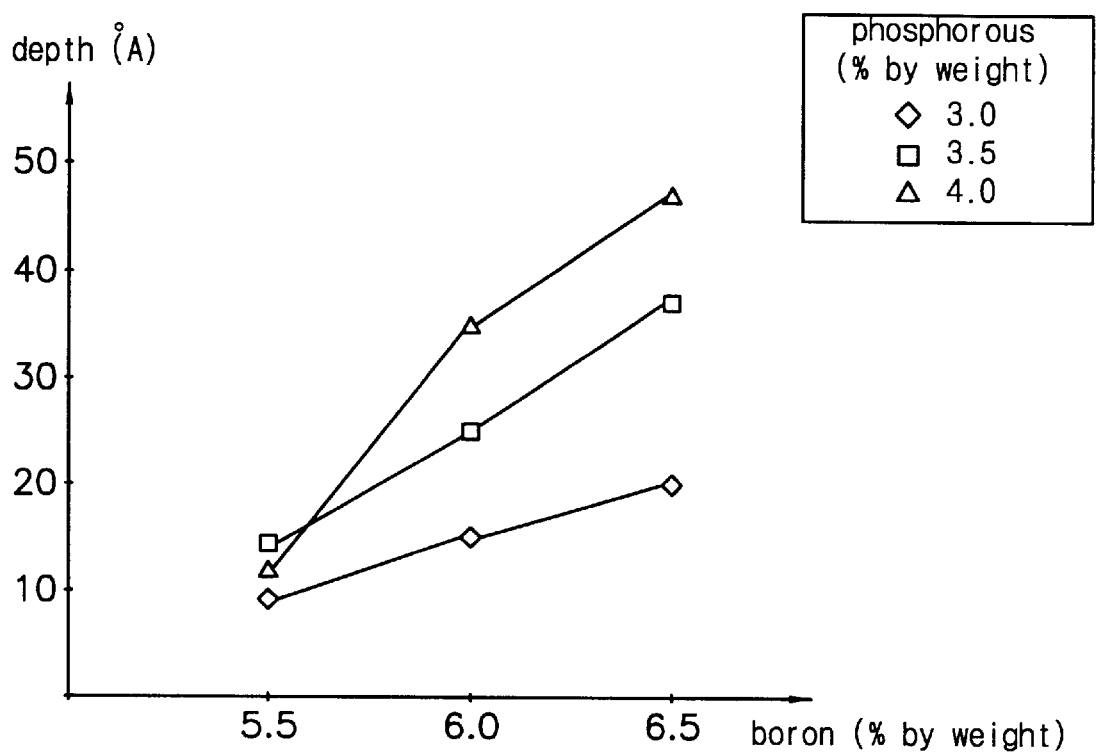
FIGS. 5 and 6 are graphs showing the thickness changes of an etch stop layer by reflowing according to the added amount of a boron and a phosphorous.
Figure 6:
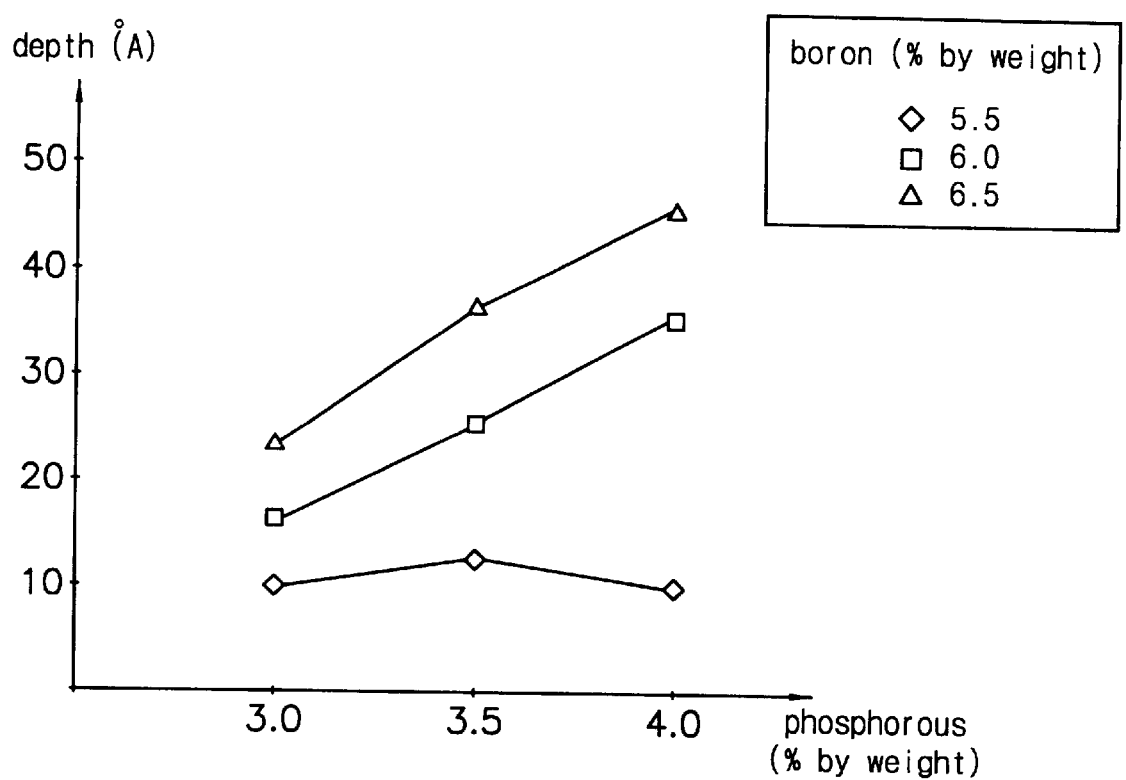

FIGS. 5 and 6 are graphs showing the thickness changes of an etch stop layer by reflowing with different added amounts of a boron and a phosphorous. Referring to FIG. 5, the graph represents the measured decrease in thickness of the etch stop layer after reflowing the BPSG layer to which about 5.5%, 6.0% and 6.5% by weight of the boron are added, and in response to each amount of the boron, about 3.0%, 3.5% and 4.0% by weight of the phosphorous are added thereto.

With reference to the line indicated by diamonds (◊), in the case where about 3.0% by weight of the phosphorous and about 5.5% by weight of the boron are added to the BPSG layer, the thickness of the etch stop layer decreases by about 10 Å. In the case where about 3.0% by weight of the phosphorous and about 6.0% by weight of the boron are added to the BPSG layer, the thickness of the etch stop layer decreases by about 15 Å. Also, in the case where about 3.0% by weight of the phosphorous and about 6.5% by weight of the boron are added to the BPSG layer, the thickness of the etch stop layer decreases by about 22 Å.

With reference to the line indicated by squares (□), in the case where about 3.5% by weight of the phosphorous and about 5.5% by weight of the boron are added to the BPSG layer, the thickness of the etch stop layer decreases by about 15 Å. In the case where about 3.5% by weight of the phosphorous and about 6.0% by weight of the boron are added to the BPSG layer, the thickness of the etch stop layer decreases by about 25 Å. Also, in the case where about 3.5% by weight of the phosphorous and about 6.5% by weight of the boron are added to the BPSG layer, the thickness of the etch stop layer decreases by about 35 Å.

With reference to the line indicated by triangles (Δ), in the case where about 4.0% by weight of the phosphorous and about 5.5% by weight of the boron are added to the BPSG layer, the thickness of the etch stop layer decreases by about 13 Å. In the case where about 4.0% by weight of the phosphorous and about 6.0% by weight of the boron are added to the BPSG layer, the thickness of the etch stop layer decreases by about 35 Å. Also, in the case where about 4.0% by weight of the phosphorous and about 6.5% by weight of the boron are added to the BPSG layer, the thickness of the etch stop layer decreases by about 45 Å.

Referring to FIG. 6, the graph represents a measured result of the decrease in thickness of the etch stop layer after reflowing the BPSG layer to which about 3.0%, 3.5% and 4.0% by weight of the phosphorous are added, and in response to each amount of the phosphorous, about 3.0%, 3.5% and 4.0% by weight of the boron are added thereto.

With reference to the graph indicated by diamonds (◊), in the case where about 3.0% by weight of the phosphorous and about 5.5% by weight of the boron are added to the BPSG layer, the thickness of the etch stop layer decreases by about 8 Å. In the case where about 3.5% by weight of the phosphorous and about 5.5% by weight of the boron are added to the BPSG layer, the thickness of the etch stop layer decreases by about 13 Å. Also, in the case where about 4.0% by weight of the phosphorous and about 5.5% by weight of the boron are added to the BPSG layer, the thickness of the etch stop layer decreases by about 12 Å.

With reference to the graph indicated by squares (□), in the case where about 3.0% by weight of the phosphorous and about 6.0% by weight of the boron are added to the BPSG layer, the thickness of the etch stop layer decreases by about 1 Å. In the case where about 3.5% by weight of the phosphorous and about 6.0% by weight of the boron are added to the BPSG layer, the thickness of the etch stop layer decreases by about 25 Å. Also, in the case where about 4.0% by weight of the phosphorous and about 6.0% by weight of the boron are added to the BPSG layer, the thickness of the etch stop layer decreases by about 35 Å.

With reference to the graph indicated by triangles (Δ), in the case where about 3.0% by weight of the phosphorous and about 6.5% by weight of the boron are added to the BPSG layer, the thickness of the etch stop layer decreases by about 22 Å. In the case where about 3.5% by weight of the phosphorous and about 6.5% by weight of the boron are added to the BPSG layer, the thickness of the etch stop layer decreases by about 35 Å. Also, in the case where about 4.0% by weight of the phosphorous and about 6.5% by weight of the boron are added to the BPSG layer, the thickness of the etch stop layer decreases by about 45 Å.

According to FIG. 5 and FIG. 6, the thickness is hardly affected by the amount of phosphorous when about 5.5% by weight of the boron is added. Also, when the insulating layer is formed after setting about 5.5% by weight of the boron and 3.0% by weight of the phosphorous as the most proper condition, the triethylphosphate (TEPO) supply which decides the amount of the phosphorous is controlled. Of course, it is understood that a range of values surrounding these optimal values would produce a sufficient quality insulating layer. For example, about 5–6% by weight of boron, and about 2–5% by weight of phosphorus still produce a good quality insulating layer, and preferably 5.25–5.75% by weight of boron, and about 2.75–4.25% by weight of phosphorus still produce a good quality insulating layer.

Therefore, an insulating layer having a BPSG layer in which the thickness of the underlying etch stop layer decreases no more than 10 Å after the reflowing, and simultaneously having a charging effect and an anisotropic etch characteristic can be formed. Thus, the insulating layer can be aggressively adopted to fabricate the semiconductor device which requires a design rule of 0.15 um or less. That is, the insulating layer of the present invention can be adopted to form a self-aligned contact and to form an inter-layer insulating layer, such as an inter metal dielectric (IMD), or an inter layer dielectric (ILD).

The example applying the inventive insulating layer for forming the self-aligned contact into the semiconductor device is described with respect to FIG. 7A to FIG. 7E, which are sectional views describing a method for fabricating a semiconductor device according to a preferred embodiment of the present invention.

Figure 7A:
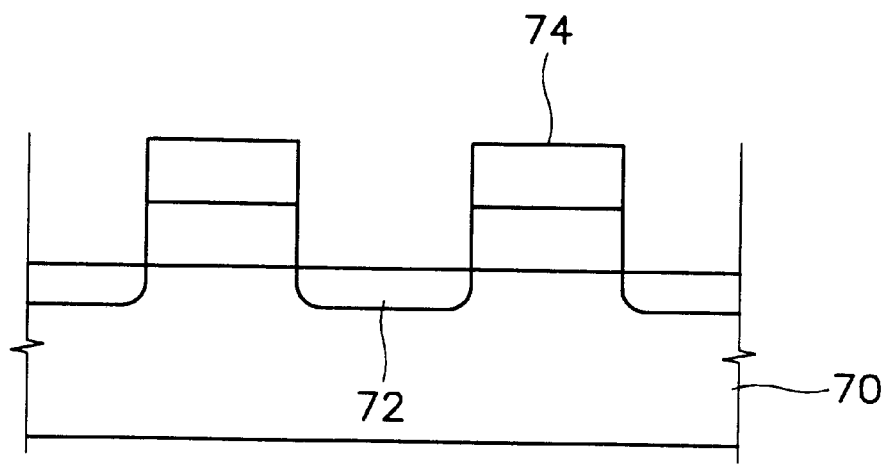
FIG. 7A to FIG. 7E are sectional views describing a method for fabricating a semiconductor device according to a preferred embodiment of the present invention.

Referring to FIG. 7A, gate electrodes 74 constituting transistors are formed on a substrate 70 on which a source and a drain 72 are formed. The source and the drain 72 are formed by means of injecting impurities into the substrate 70, and the gate electrodes 74 are formed by depositing a polysilicon layer and a tungsten silicon WSi layer, and by photolithography etching the layers through a mask.

Figure 7B:
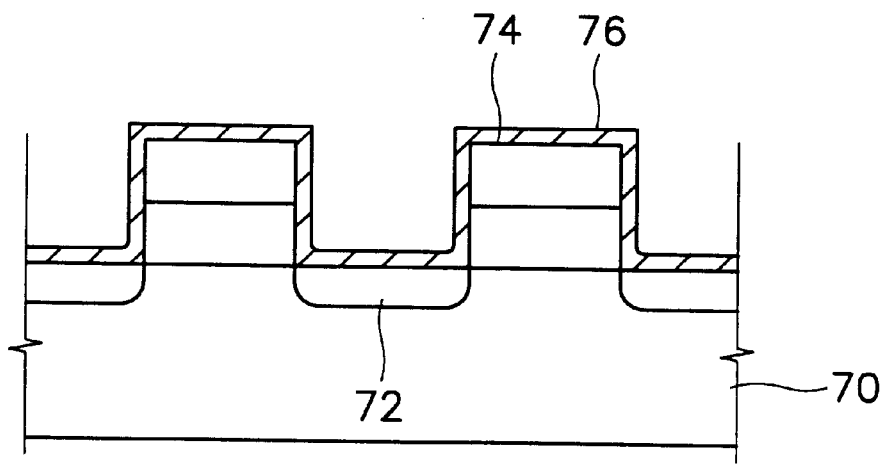

In FIG. 7B, an etch stop layer 76 comprising a nitride silicon layer is successively formed on the substrate 70 and the gate electrodes 74. The nitride silicon layer is formed to have a thickness of about 80 Å by chemical vapor deposition. The nitride silicon layer prevents the substrate 70 from being damaged by etching and prevents the substrate 70 from being oxidized by exposure, and simultaneously prevents the penetrating of humidity generated by reflowing into the substrate 70.

Figure 7C:
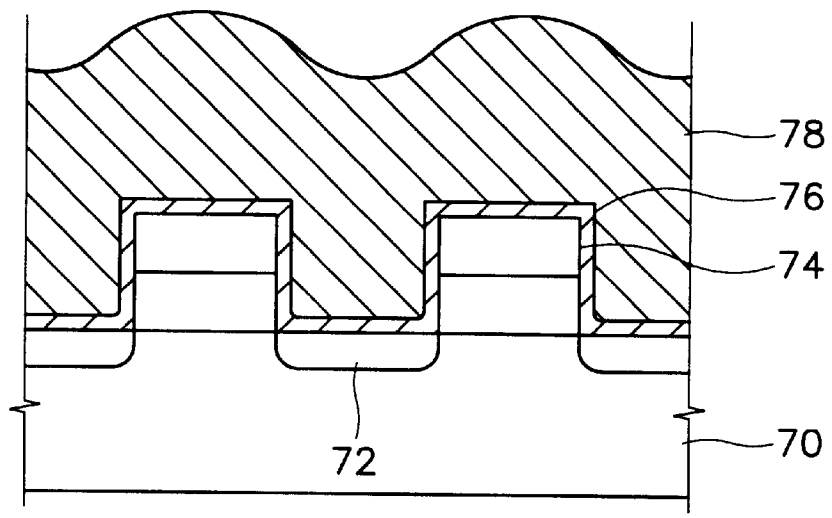

In FIG. 7C, the insulating layer 78 having about 5.5% by weight of the boron and about 3.0% by weight of the phosphorous is formed on the etch stop layer 76. The insulating layer consists of a BPSG layer which is formed by adding to the TEOS, the triethylborate (TEB) used as the source material of the boron and the triethylphosphate (TEPO) used as the source material of phosphorous. The insulating layer 78 is formed to have a thickness of about 9,500 Å.

To form the insulating layer 78 having the BPSG layer, an oxidizing atmosphere is prepared around the substrate 70 on which the etch stop layer 76 is formed. About 4,500 sccm of the oxygen gas is supplied to prepare the oxidizing atmosphere. Then, about 4,500 sccm of the oxygen gas and about 800 sccm of the TEOS are sequentially supplied thereto to form the first seed layer on the etch stop layer. Next, about 4,500 sccm of the oxygen gas, about 800 sccm of the TEOS, and about 200 sccm of the triethylborate (TEB) used as the source material of boron, are supplied thereto to form the second seed layer on the first seed layer. Thereafter, about 800 sccm of the TEOS, about 200 sccm of the TEB, about 85 sccm of the triethylphosphate (TEPO) used as the source material of phosphorous, and about 4,500 sccm of the ozone gas are supplied thereto to form the BPSG layer on the etch stop layer having the first and the second seed layers.

The BPSG layer is formed in a vacuum environment, and the vacuum environment is prepared by supplying about 2,000 sccm of the helium gas and about 4,000 sccm of the nitrogen gas. The temperature of the stage which supports the substrate maintains about 480° C.

Figure 7D:
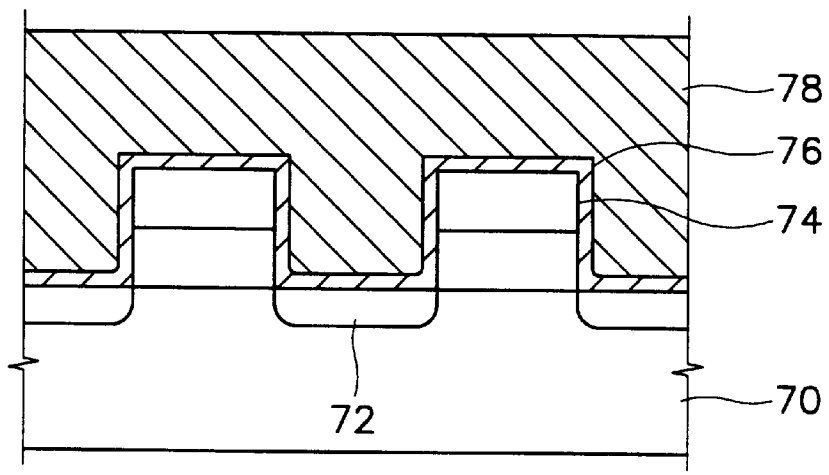

In FIG. 7D, the insulating layer 78 is reflowed at a temperature of about 850° C. using hydrogen gas and oxygen gas. Accordingly, the surface of the insulating layer 78 is evenly formed and at the same time, the insulating layer 78 is sufficiently charged between the gate electrodes 74.

Since the insulating layer 78 is formed by the BPSG layer having about 5.5% by weight of the boron and about 3.0% by weight of the phosphorus, the decrease in thickness of the nitride silicon layer 76 thereunder can be reduced by less than 10 Å, and simultaneously enough charging effect can be achieved.

In present semiconductor devices, since the gap between the elevated regions and the recessed regions formed by the gate electrodes are very close, it is not easy to sufficiently charge the gaps among the gate electrodes, unless the insulating layer has sufficient fluidity. The elevated and recessed regions are not restricted to those made by just gate electrodes, but also the elevated and recessed regions formed by the patterns like the window.

Figure 7E:
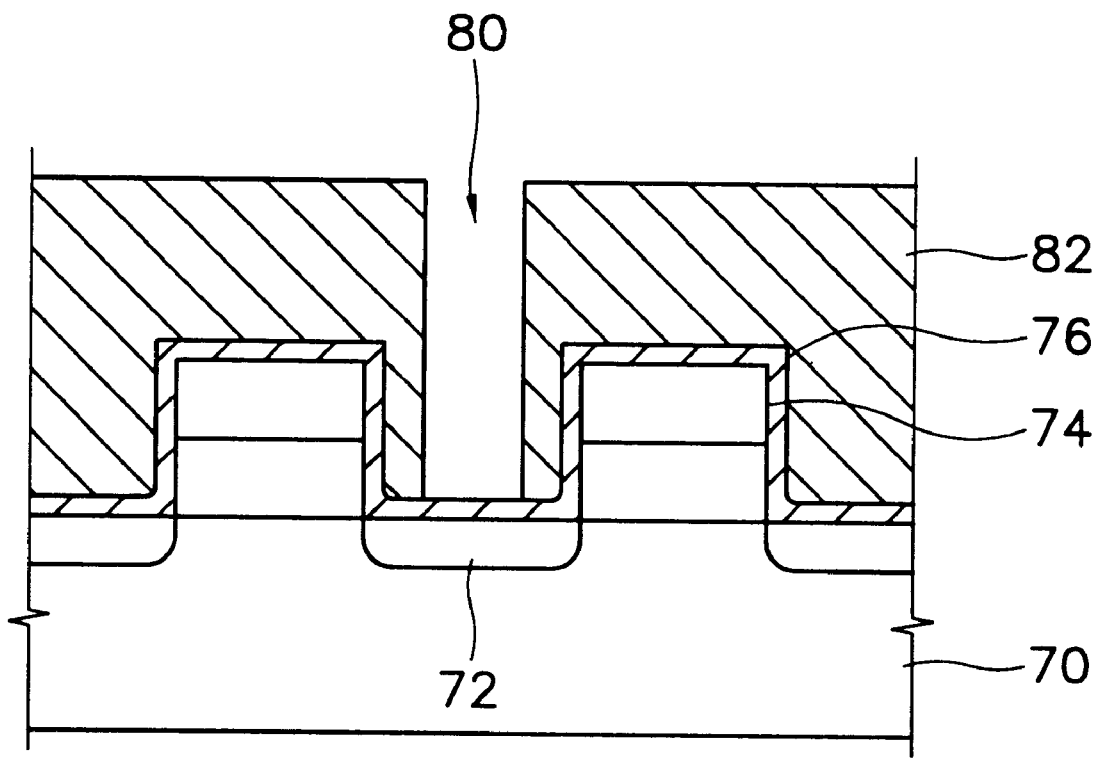

In FIG. 7E, the insulating layer 78 is formed as an insulating layer pattern 82 having the window 80 by executing the self-aligned contact. The window 80 is formed by photolithographic etching, and an etching gas including CFx (wherein x is a positive number) is used to etch the insulating layer 78. The etching is executed with a selectivity ratio of the insulating layer 78 and the nitride silicon layer 76 thereunder. Also, the etch is easily stopped because the thickness of the nitride silicon layer 76 is not changed by the reflowing. Moreover, the shoulder margin can be sufficiently secured when the self-aligned contact is implemented by the nitride silicon layer 76. Accordingly, when the next process for charging the window is executed with the metal layer, the window 80 can be sufficiently charged by the metal layer.

Accordingly, in the semiconductor device fabrication, the insulating layer having the BPSG layer which is not affected by the processing characteristic before and/or after can be formed by efficiently controlling the amount of the boron and the phosphorous in the layer.

The decrease in thickness of the etch stop layer thereunder can be minimized, and simultaneously, the sufficient charging effect and the anisotropic etch characteristic can be secured even if the insulating layer is reflowed using hydrogen gas and oxygen gas. Thus, when the insulating layer is adopted to processes for fabricating the semiconductor devices, it is expected to elevate the reliability of the semiconductor device.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A method for forming an insulating layer comprising:
preparing an oxidizing atmosphere by supplying oxygen gas into a chamber to surround a substrate on which the insulating layer will be formed;
forming a first seed layer of said insulating layer on said substrate by supplying a tetraethylorthosilicate (TEOS) and the oxygen gas into the chamber;
forming a second seed layer of said insulating layer, said second seed layer capable of controlling an amount of boron added to said first seed layer by supplying triethylborate (TEB), the TEOS and the oxygen gas into the chamber; and
forming a BPSG layer as the insulating layer, which includes said first seed layer and said second seed layer, said BPSG layer capable of controlling the amount of the boron and phosphorus added thereto by supplying the TEB, the TEOS, triethylphosphate (TEPO), and an ozone gas into the chamber.

2. The method as claimed in claim 1, further comprising:
reflowing said insulating layer to evenly form an upper surface of said insulating layer using a hydrogen gas and the oxygen gas, and
simultaneously charging recessed regions with said insulating layer among elevated regions and recessed regions of a surface of said substrate.

3. The method as claimed in claim 1, wherein said first seed layer is formed by supplying the TEOS and the oxygen gas into the chamber with a mixed ratio of about 1:5.4 to 5.8.

4. The method as claimed in claim 1, wherein said second seed layer is formed by supplying the TEOS, the TEB and the oxygen gas into the chamber with a mixed ratio of about 1:0.2 to 0.3:5.4 to 5.8.

5. The method as claimed in claim 1, wherein said BPSG layer is formed by supplying the TEOS, the TEB, the TEPO, and the ozone gas into the chamber with a mixed ratio of about 1:0.2 to 0.3:0.09 to 0.12:5.4 to 5.8.

6. The method as claimed in claim 1, wherein said oxidizing atmosphere, said first seed layer, said second seed layer and said BPSG layer are formed in a vacuum environment in the chamber, and wherein the vacuum environment is provided by supplying a helium gas and a nitrogen gas into the chamber with a mixed ratio of about 1:1.8 to 2.2.

7. The method as claimed in claim 1, wherein said insulating layer is formed after forming an etch stop layer on said substrate to prevent said substrate from being damaged by etching when said insulating layer is etched to form an insulating layer pattern having a window on said substrate.

8. A method for fabricating a semiconductor device comprising:
forming an etch stop layer on a substrate for preventing said substrate from being damaged by etching;
forming an insulating layer, to which about 5.25–5.75% by weight of boron and about 2.75–4.25% by weight of phosphorus is added, on said etch stop layer;
reflowing said insulating layer to evenly form an upper surface of said insulating layer, and simultaneously charging recessed regions with said insulating layer among elevated regions and recessed regions of said substrate; and
etching a predetermined portion of said insulating layer to form an insulating layer pattern having a window which exposes an upper surface of said underlying etch stop layer;
wherein said forming said insulating layer comprises:

forming a first seed layer on said substrate by supplying a tetraethylorthosilicate (TEOS) and the oxygen gas into a chamber with a mixed ratio of about 1:5.4 to 5.8;

forming a second seed layer on said first seed layer by supplying the TEOS, a triethylborate (TEB) and the oxygen gas into the chamber with a mixed ratio of about 1:0.2 to 0.3:5.4 to 5.8; and forming a BPSG layer as the insulating layer, including said first seed layer and said second seed layer, by supplying the TEOS, the TEB, a triethylphosphate and an ozone gas into the chamber with a mixed ratio of about 1:0.2 to 0.3:0.09 to 0.12:5.4 to 5.8, wherein said oxidizing atmosphere, said first seed layer, said second seed layer and said BPSG layer are formed in a vacuum environment, and wherein the vacuum environment is provided by supplying helium gas and a nitrogen gas with a mixed ratio of 1:1.8 to 2.2.

9. The method as claimed in claim 8, wherein said etch stop layer is comprised of nitride silicon and has a thickness within the range of from about 60 to about 140 Å.

10. The method as claimed in claim 8, wherein said elevated regions and the recessed regions are formed by gate electrodes.

11. The method as claimed in claim 8, wherein said elevated regions and the recessed regions are formed by patterns having a window.

12. The method as claimed in claim 8, wherein said insulating layer is formed to have a thickness within the range of about from 9,000 to 10,000 Å.

13. The method as claimed in claim 8, wherein said insulating layer is etched by an etch gas having a CFx structure.

* * * * *